United States Patent [19]

Choi

[11] Patent Number: 5,892,714

[45] Date of Patent: Apr. 6, 1999

[54] METHOD OF PROGRAMMING AND/OR VERIFYING A THRESHOLD VOLTAGE LEVEL OF A NONVOLATILE MEMORY CELL

[75] Inventor: Woong Lim Choi, Chungcheongbuk-do, Rep. of Korea

[73] Assignee: LG Semicon Co., Ltd., Cheongju, Rep. of Korea

[21] Appl. No.: 890,564

[22] Filed: Jul. 9, 1997

[30] Foreign Application Priority Data

Jul. 12, 1996 [KR] Rep. of Korea .................. 1996/28174

[51] Int. Cl.⁶ .................................................. G11C 16/06
[52] U.S. Cl. ................................ 365/185.22; 365/185.03; 365/185.24
[58] Field of Search ......................... 365/185.03, 185.22, 365/185.24, 185.15, 185.28

[56] References Cited

U.S. PATENT DOCUMENTS

| | | | |
|---|---|---|---|
| 5,043,940 | 8/1991 | Eliyahou | 365/185.3 |
| 5,386,388 | 1/1995 | Atwood et al. | 365/185.22 |
| 5,422,842 | 6/1995 | Cernea et al. | 365/185.26 |
| 5,426,611 | 6/1995 | Maruyama | 365/185.22 |
| 5,452,249 | 9/1995 | Miyamoto et al. | 365/185.24 |
| 5,513,193 | 4/1996 | Hashimoto | 365/185.22 |
| 5,568,426 | 10/1996 | Roohparvar et al. | 365/185.22 |

*Primary Examiner*—Son Mai
*Attorney, Agent, or Firm*—Fleshner & Kim

[57] ABSTRACT

A method of at least one of programming and verifying a threshold voltage of a nonvolatile memory cell. The memory cell includes a control gate, a floating gate, a drain, a source, and a channel region between the drain and the source. The method is a voltage-type programming compared to a current type programming. A first voltage, which varies in correspondence to each threshold level programming, is applied to the control gate, and second and third voltages are applied to the drain and the source, respectively, so that the channel region is turned off at an initial stage and charge carriers for the programming are transferred from the floating gate to the drain. A conductivity of the channel region is monitored during each threshold level programming. The application of at least one voltage among the first voltage, second voltage and third voltage is cut-off to stop the programming when the monitored conductivity reaches a reference value which may be constant for every threshold level to be programmed and/or verified.

38 Claims, 5 Drawing Sheets

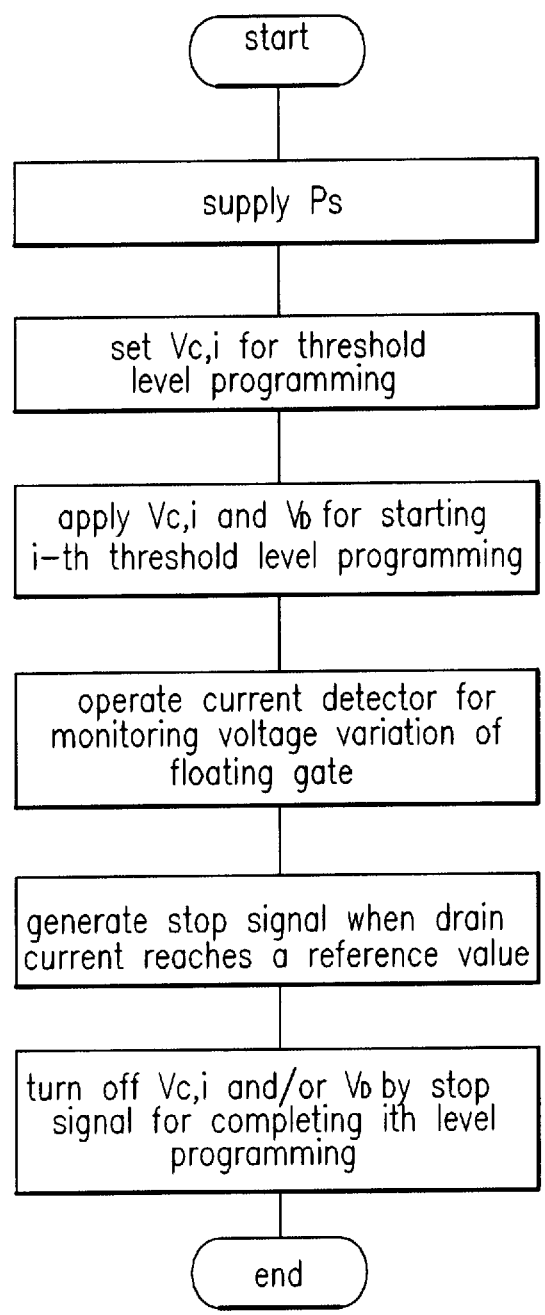

METHOD OF PROGRAMMING AND/OR VERIFYING A THRESHOLD VOLTAGE LEVEL OF A NONVOLATILE MEMORY CELL

BACKGROUND OF THE INVENTION

1. Field of the Invention

The present invention relates to a method of programming and/or verifying a nonvolatile memory, and particularly to a method of programming and/or verifying a threshold voltage of a nonvolatile memory.

2. Background of the Related Art

The packing density of a conventional nonvolatile memory corresponds in a one to one fashion to the number of memory cells. When nonvolatile semiconductor memory devices such as EEPROMs and flash EEPROMs are used as mass storage media, it is difficult to overcome the high cost-per-bit of the memories. To solve such a problem, a multibit cell stores data of over two bits in one memory cell to enhance the density of data on the same chip area without increasing the size of the memory cell. To achieve the storage of over two bits, more than two threshold voltage levels can be programmed on respective memory cells.

For example, in order to store data of two bits for every cell, the respective cells must be programmed in $2^2$ (four) threshold voltage levels. The four threshold voltage levels correspond to logic states 00, 01, 10, and 11, respectively. During the programming of the multiple levels, a problem arises due to a statistical distribution of the respective threshold voltage levels.

A typical distribution value is about 0.5 V. By precisely adjusting the respective threshold voltage levels, the voltage distribution can be reduced so that more voltage levels can be programmed, which increase the number of bits per cell. To adjust the threshold voltage levels in a conventional method, repeated programming and verification are performed. For programming, a series of voltage pulses are applied to the cells to adjust the threshold voltage levels. To verify whether a cell has reached an intended threshold voltage level, a read operation is performed between the respective programming voltage pulses. Programming is concluded when the verified threshold voltage level reaches the intended threshold voltage level.

In the conventional method of repeated programming and verification, there is difficulty in reducing the error distribution of the threshold voltage level due to the limited pulse width of a program voltage. Further, the algorithm of repeated programming and verification is implemented with additional circuits, increasing the area of peripheral circuits on the chip. The repetitive method also prolongs the programming time. To solve such problems, R. Cernea of SunDisk Co., Ltd. suggested a method of simultaneous programming and verification in U.S. Pat. No. 5,422,842.

FIG. 1A illustrates the symbol and circuit diagram of the electrically writable nonvolatile memory. The nonvolatile memory cell includes a control gate 1, a floating gate 2, a source 3, a channel area 4, and a drain 5. When voltages sufficient to cause programming are applied to control gate 1 and drain 5, a current flows between drain 5 and source 3, and electrons are injected into the floating gate 2. This current is compared to a reference current, which varies for each threshold voltage level to be programmed. When the current reaches a value equal to or smaller than the reference current, a programming completion signal is produced. The auto verification of a programmed condition at the same time as programming may compensate for the disadvantage of the repetitive program verification.

However, as disclosed in U.S. Pat. No. 5,043,940, the reference current varies for each of the threshold voltage levels to be programmed during the multi-level programming method. As shown in FIG. 1B, the relationship between the reference currents and the cell threshold voltages is neither explicit nor linear. Therefore, a current controlled type programming method like that in the aforementioned prior art has a disadvantage that a direct and effective multi-level control cannot be easily implemented.

The above references are incorporated by reference herein where appropriate for appropriate teachings of additional or alternative details, features and/or technical background.

SUMMARY OF THE INVENTION

It is an object of the present invention is to solve the problems of the prior art.

It is another object of the present invention to simultaneously program and/or to verify a nonvolatile memory having cells with a plurality of threshold voltage levels.

It is another object of the present invention to program and/or to verify a nonvolatile memory based on a control gate voltage.

It is another object of the present invention to provide erasure of the nonvolatile memory without pre-programming.

It is another object of the present invention to program and/or to verify a nonvolatile memory by an OFF-to-ON method.

It is another object of the present invention to provide a method to program and/or to verify a nonvolatile memory with distribution of threshold voltage levels which are not variable over time.

It is a further object of the present invention to program and/or to verify a nonvolatile memory by only varying a control gate voltage.

It is a further object of the present invention to program and/or to verify a nonvolatile memory by transferring charge carriers into a floating gate.

It is still another object of the present invention to provide a constant reference current value during the programming and/or verifying of a nonvolatile memory.

It is still another object of the present invention to provide a control gate voltage which varies linearly with a threshold voltage level to be programmed and/or verified in a cell of non-volatile memory.

To achieve the foregoing and other objects and advantages, and to overcome the shortcomings discussed above, a method of at least one of programming and verifying a memory cell to one of a plurality of threshold levels, the memory cell having a control gate, a floating gate, first and second electrode regions and a channel region between the first and second electrode regions, comprising the steps of: (a) accumulating charge carriers in the floating gate to a first charge amount level; and (b) transferring the charge carriers in the floating gate to one of the first and second electrode regions to a second charge amount level inducing one of the plurality of threshold levels on the control gate.

The present invention can be also achieved, in whole or in part, by a method of at least one of programming and verifying a threshold level of a nonvolatile memory cell, the nonvolatile memory cell having a control gate, a floating gate, a drain, a source, and a channel region between the drain and the source, the method comprising the steps of: (a) applying a first voltage to the control gate, applying a second voltage to the drain and applying a third voltage to the source, such that the channel region is turned off at an initial stage and charge carriers for the programming are transferred from the floating gate to the drain; (b) monitoring a conductivity of the channel region during programming of the nonvolatile memory cell; and (c) cutting-off application of at least one voltage among the first voltage, second voltage and third voltage to stop the programming when the monitored conductivity reaches a reference value.

The present invention may also be achieved, in whole or in part, by a method of at least one of setting and verifying a threshold voltage of a cell in a nonvolatile memory, the cell having a control gate, a floating gate, first and second electrode regions and a channel region between the first and second electrode regions, comprising the steps of: (a) accumulating an amount of charge carriers in the floating gate to a first level; (b) transferring the charge carriers from the floating gate to one of the first and second electrode region to vary the amount of charge carriers in the floating gate; (c) monitoring a variation of the charge carriers in the floating gate; and (d) discontinuing the application of the first voltage when the amount of charge carriers in the floating gate reaches a second level corresponding to the threshold voltage of the cell.

The present invention may be achieved by a method of at least one of programming and verifying a nonvolatile memory cell having at least two threshold levels, the nonvolatile memory cell having a control gate, a floating gate, a drain, a source, and a channel region between the drain and the source, the method comprising the steps of: (a) applying a first voltage, which varies in correspondence to each threshold level programming, to the control gate, applying a second voltage to the drain and applying a third voltage to the source, such that the channel region is turned off at an initial stage and charge carriers for the programming are transferred from the floating gate to at least one of the drain and source; (b) monitoring a conductivity of the channel region during each threshold level programming of the nonvolatile memory cell; and (c) stopping application of at least one among the first voltage, second voltage and third voltage to stop the programming when the monitored conductivity reaches a reference value.

Additional objects, advantages and other features of the invention will be set forth in part in the description which follows and in part will become apparaent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein:

FIG. 3 is a generic flowchart showing a single or a multi-level programming and/or verification according to an embodiment of the present invention;

DETAILED DESCRIPTION OF PREFERRED EMBODIMENTS

A programming operation is defined as a data writing operation, and an erasure operation is defined as an operation in which all the data in a block to be erased are brought to a prescribed or presettable condition. The erasure of data may bring a threshold voltage state in a nonvolatile memory cell to the lowest or the highest state. In other words, either an injection into or an extraction from a floating gate can be defined as the erasure. For example, in a preferred embodiment of the present invention, an erasure operation may result in bringing the n-type channel FET of the nonvolatile memory cells to the highest state of the threshold voltages.

Figure 2:
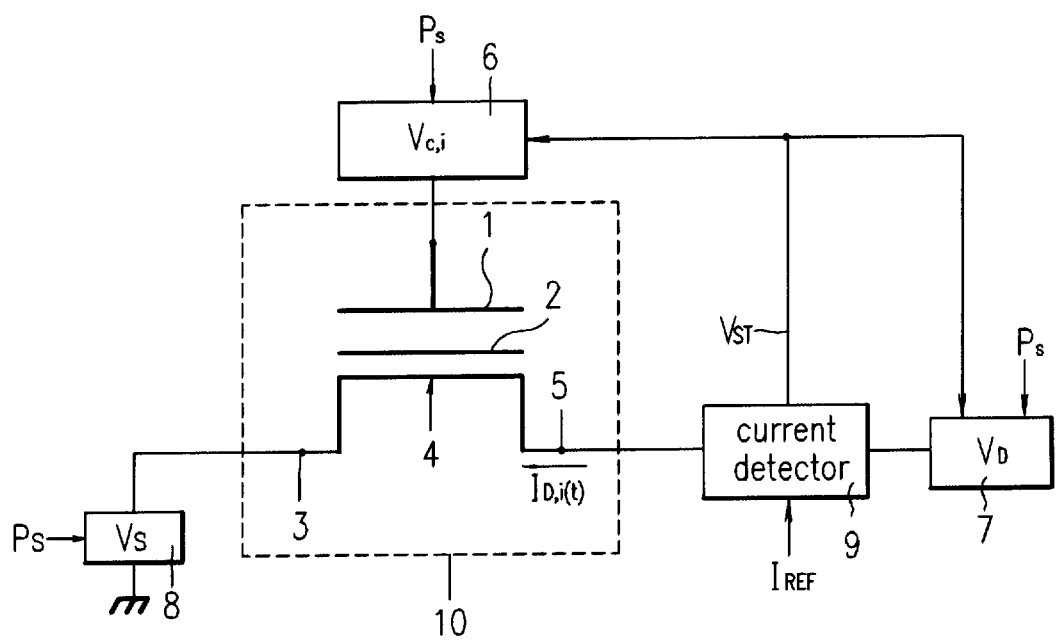
FIG. 2 is a diagram explaining a programming and/or verification method using current detection according to the first embodiment of the present invention.

FIG. 2 illustrates a diagram of a method for programming and/or verifying a nonvolatile memory cell according to a preferred embodiment of the present invention. The method is illustrated for convenience to a memory cell, however, as can be appreciated, the present method is applicable to all the cells of a nonvolatile memory device. As shown, the nonvolatile memory device system includes a first voltage source 6, a second voltage source 7, a third voltage source 8, a current detector 9, and a nonvolatile memory cell 10. The nonvolatile memory cell 10 may comprise a simple stacked-gate memory cell structure, a split-channel memory cell structure of the like. The label $P_s$ indicates an externally supplied programming start signal, and the label $V_{ST}$ indicates a programming stop signal generated by the current detector.

The first voltage source 6 supplies a voltage $V_{C,i}$ (i=0, 1, 2, ... n−1) to a control gate 1 of a nonvolatile memory cell 10 for programming and/or verifying an i-th threshold voltage level during multi-level programming. Accordingly, the voltage $V_{C,i}$ has values that vary for each programing and/or verifying of the threshold voltage level in the nonvolatile memory cell 10. The second voltage source 7 applies a voltage $V_D$ to an electrode region, e.g., a drain 5, and the third voltage source 8 applies a voltage $V_S$ to another electrode region, e.g., a source 3. This third voltage source $V_S$ may be of any value, but, for convenience, it is assumed to provide a ground voltage GND. The label $I_{D,i}(t)$ indicates a level or value of the current flow dependent upon time through the drain 5.

The current detector, which receives a constant reference current value $I_{REF}$ for each threshold voltage level programming, produces a programming and/or verification stop signal $V_{ST}$ when the current $I_{D,i}(t)$ flowing through drain 5 reaches the constant reference current value $I_{REF}$ during each i-th threshold level programming and/or verification. The reference current value $I_{REF}$ of the current detector 9 is dependent on the electrical characteristics of the nonvolatile memory cell 10. The label $t_{p,i}$ refers to the time when the i-th threshold voltage level programming and/or verification is completed.

The current flow $I_{D,i(t)}$ through the drain 5 is triggered by a voltage $V_{F,i}(t)$ at the floating gate 2 during the i-th level programming and/or verification. The leakage current is very small during a turned off state of a channel region(or a subthreshold state). During the initial stage of programming, the turned off state is maintained for a certain time period until the turn on state of the channel region, resulting in a sharp increase of the level of current flow $I_{D,i}(t)$. The current detector 9 generates a program and/or verification stop signal $V_{ST}$ at a prescribed time when the level or value of current flow $I_{D,i}(t)$ reaches the reference current $I_{REF}$.

FIG. 3 illustrates a generic flowchart showing single or multi-level programming and/or verification steps of the present invention in accordance with the preferred embodiment. In the preferred embodiment, a nonvolatile memory cell, such as EEPROM cell, includes the control gate 1, floating gate 2, drain 5, source 3, and the channel region 4 between the drain 5 and source 3, which has been erased to, for example, the highest threshold voltage level. To initiate the programming and/or verification, a program start signal is externally applied to the first, second and third voltage sources 6, 7 and 8.

In response, a first voltage is applied to the control gate 1, a second voltage is applied to the drain 5, and a third voltage is applied to the source 3. Although charge carriers are transferred from the floating gate 2 to the drain 5, the channel region is turned off at an initial stage. For multi-level programming, the first voltage is varied in correspondence to each threshold voltage level to be programmed. The second voltage applied to the drain 5 is higher than the third voltage applied to the source 3 for memory cells, e.g., of n-type transistors.

A value of current flow $I_{D,i}(t)$ (or a conductivity of the channel region 4) through the drain 5 is monitored during programming and/or verification of each threshold voltage level of the nonvolatile memory cell in an array. When the level of current flow reaches the reference current value, at least one of the first, second and third voltages applied to the control gate 1, drain 5 and source 3, respectively, is cut off to stop the programming and/or verification.

Figure 4A:
FIGS. 4A–4H are diagrams of waveforms present at the respective nodes of FIG. 2.
Figure 4B:
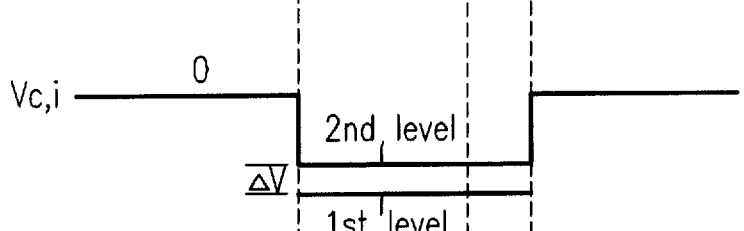
Figure 4C:

FIGS. 4A–4H illustrate more in detail the method of programming and/or verification for a nonvolatile memory cell of an n-type channel transistor formed on a p-type substrate. First, when a programming start signal $P_S$, as shown in FIG. 4A, is externally applied to initiate a single or a multi-level programming and/or verification, a positive voltage $V_{C,i}$, corresponding to the i-th threshold voltage level programming, is applied to the control gate 1. As shown in FIGS. 4B and 4C, the first voltage $V_{C,i}$ and second voltage $V_D$ are supplied to the control gate 1 and the drain 5, respectively, from the first and second voltage sources 6 and 7 at the same time as when the programming start signal $P_S$ is applied. As a result, charge carriers, e.g., electrons, are transferred from the floating gate 2 to the drain 5 by tunneling or hot electron injection.

After the voltages $V_{C,i}$ and $V_D$ are applied to the control gate 1 and the drain 5 respectively, the current detector 9 is turned-on for monitoring the variation of charges at the floating gate 2. When the voltages $V_{C,i}$ and $V_D$ are applied to the control gate 1 and the drain 5 respectively, a voltage $V_{F,i}(t)$, as shown in FIG. 4C is induced to the floating gate 2. During the initial time period, an initial voltage $V_{F,i}(t=0)$ at the floating gate 2 turns off the channel region 4 in the FET, i.e., the initial voltage $V_{F,i}(t=0)$ is lower than the threshold voltage $V^F_{TH}$ required for the channel beneath the floating gate to conduct. Accordingly, there is no current flowing in the drain 5.

Figure 4D:
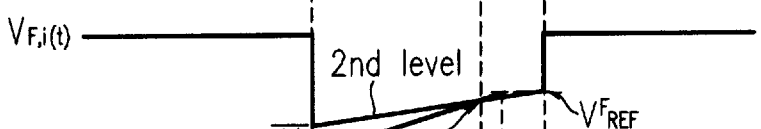
Figure 4E:
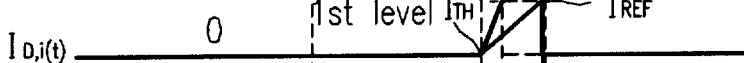
Figure 4F:

As the programming proceeds, electrons are extracted from the floating gate to increase the voltage $V_{F,i}$ in the floating gate 2, as shown in FIG. 4D. When the voltage of the floating gate 2 reaches the voltage $V^F_{TH}$, a current $I_{TH}$ starts to flow through the drain 5 as shown in FIGS. 4D and 4E. For the i-th threshold level, the programming and/or verification is completed when the level of current flow $I_{D,i}(t)$ reaches the reference value $I_{REF}$, and a programming stop signal $V_{ST}$ as shown in FIG. 4F is generated from the current detector 9.

Thus, during the i-th threshold level programming, the current detector 9 monitors level of current flow $I_{D,i}(t)$ through the drain 5. By monitoring the current flow, the current detector 9 monitors a variation of a voltage $V_{F,i}(t)$ (FIG. 4D) or a variation of an amount of charge carriers $Q_{F,i}$ at the floating gate 2 (FIG. 4H) during the i-th threshold voltage level programming. Such monitoring also corresponds to the current detector 9 monitoring a variation of the current flowing in the channel region. In other words, when the current $I_{D,i}(t)$ at the drain 5 reaches the reference current $I_{REF}$ as shown in FIG. 4E, the voltage in the floating gate 2 reaches a reference voltage $V^F_{REF}$ of the floating gate 2, as shown in FIG. 4D. The monitoring of the level of current flow $I_{D,i}(t)$ may also correspond as a monitoring of a conductivity of an inversion layer formed in the channel region 4.

Referring to FIG. 2, programming stop signals $V_{ST}$ are applied to the first and second voltage sources 6 and 7. As can be appreciated, the program stop signal may also be applied to the third voltage source 8 if ground potential is not used. In response to programming stop signals $V_{ST}$, the first and/or second voltage sources 6 and 7 discontinue the application of at least one of the first voltage $V_{C,i}$ and the second voltage $V_D$, as shown in FIGS. 4B and 4C to the control gate 1 and the drain 5. In other words, referring to FIGS. 4G and 4H, when the level of current flow $I_{D,i}(t)$ at time $t=t_{P,i}$ (completion time of programming and/or verification) is detected to be higher than the reference current $I_{REF}$, the i-th threshold voltage level programming and/or verification is completed.

Figure 4G:
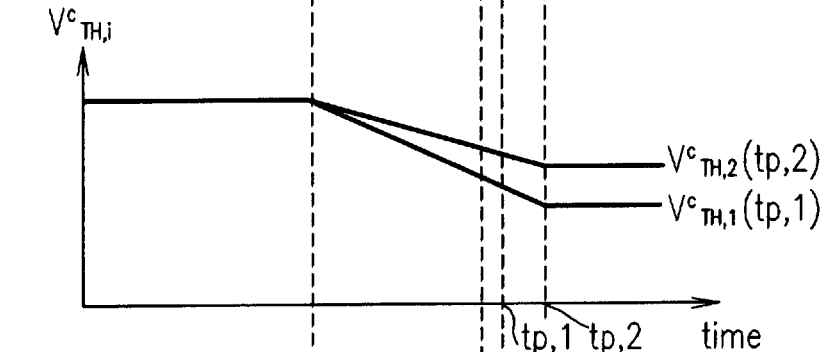

FIG. 4G is a graph showing variation of threshold voltages $V^C_{TH,1}$ and $V^C_{TH,2}$ at the control gate 1 versus time when the i-th threshold level is one (1) and two (2), respectively. FIG. 4G also shows that the threshold voltage $V^C_{TH,i}$ at control gate 1 varies, e.g., decreases, as the order of the level changes, e.g., decreases from 2-th threshold level to 1-th threshold level, during the multi-level programming, which can be done by varying, e.g., decreasing, the first voltage $V_{C,i}$. The first and second level completion program and/or verification times $t_{P,1}$ and $t_{P,2}$ are different because shifts of the control gate voltage $V_{C,i}$ and threshold voltage $V^C_{TH,i}$ of the respective levels are different.

Figure 4H:
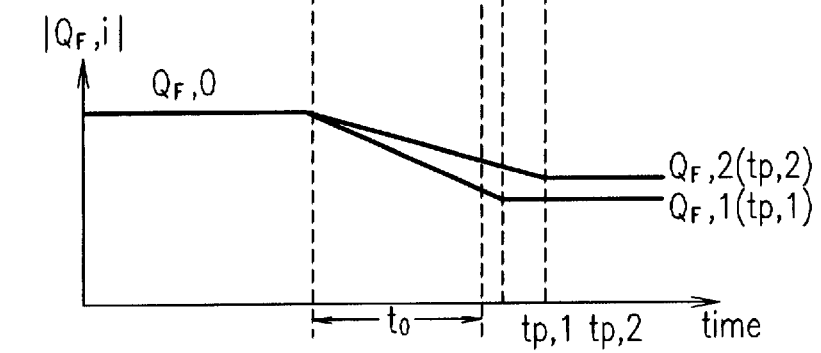

FIG. 4H is a graph showing variations in amount of charge carriers at the floating gate 2 from the initial charge amount $Q_{F,0}(0)$ to the charge amounts $Q_{F,1}(t_{P,1})$ and $Q_{F,2}(t_{P,2})$ at the time when the first and second threshold level programming and/or verification is completed for the i-th threshold voltage level of one and two, respectively. Referring to FIG. 4H, when the voltages $V_{F,1}(t)$ and $V_{F,2}(t)$ at floating gate 2 reach the same reference voltage $V^F_{REF}$ (corresponding to the reference currents $I_{REF}$ ($t=t_{P,1}$) and $I_{REF}(t=t_{P,2})$, which are the same levels) at the floating gate 2, the charge amount at floating gate 2 is decreased from the initial amount $Q_{F,0}(0)$ to amount $Q_{F,1}(t_{P,1})$ and to amount $Q_{F,2}(t_{P,2})$, respectively. After finishing the programming for all prescribed levels, charge amounts of $Q_{F,1}(t_{P,1})$, $Q_{F,2}(t_{P,2})$, etc., are maintained in the floating gate 2.

FIGS. 4A–4F also illustrate the programming and/or verification method for i-th threshold voltage programming when i=1 and 2. As shown in FIG. 4B, control gate voltages $V_{C,1}=V$ and $V_{C,2}=V-\Delta V$ are applied during the first and second (i=1 and 2) threshold level programming. Due to the different voltages applied at the control gate 1, the voltages $V_{F,1}(t)$ and at the floating gate 2 rise at different rates. The currents $I_{D,1}(t)$ and $I_{D,2}(t)$ remain at about zero until the voltage $V_{F,1}(t)$ and $V_{F,2}(t)$ at the floating gate 2 reaches the threshold voltages $V^F_{TH}$. As the voltages $V_{F,1}(t)$ and $V_{F,2}(t)$ continue to increase, the currents $I_{D,1}(t)$ and $I_{D,2}(t)$ increase to $I_{REF}$, and the stop signals $V_{ST,1}$ and $V_{ST,2}$ are generated when $I_{D,1}(t_{P,1})$ and $I_{D,2}(t_{P,2})$ equal $I_{REF}$.

As shown in FIG. 4D and 4E, the programming stop signal is generated when the currents $I_{D,1}(t_{P,1})$ and $I_{D,2}(t_{P,2})$ equal $I_{REF}$. The time period depends on the programming characteristics of the given device. Further, as can be appreciated, the reference current $I_{REF}$ (or reference voltage $V_{REF}$) may be the threshold current $I_{TH}$ (or threshold voltage $V^F_{TH}$) or any arbitrary value greater than the threshold current $I_{TH}$.

Figure 5A:
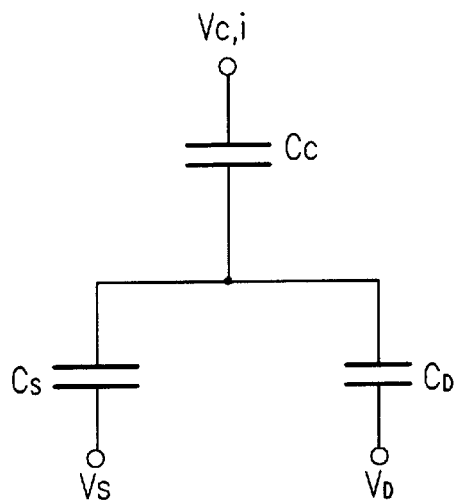
FIG. 5A is an equivalent circuit diagram of the capacitances of the nonvolatile memory of FIG. 1A.

The relationship between the voltage $V_{C,i}$ applied to the control gate 1 and the threshold voltage at a corresponding level, which is one of significant results of the present invention, will be explained hereinafter. In FIG. 5A, $C_C$ represents the capacitance between the control gate 1 and the floating gate 2, $C_D$ represents the capacitance between the drain 5 and the floating gate 2, and $C_S$ represents the capacitance between the source 3 (including the substrate) and the floating gate 2.

Sum $C_T$ of those capacitances can be expressed by the following equation (1):

$$C_T = C_C + C_D + C_S \quad (1)$$

The coupling coefficients of the respective capacitances are defined by the following equations (2):

$$\alpha_C = C_C/C_T, \ \alpha_D = C_D/C_T,$$

and $$\alpha_S = C_S/C_T \quad (2)$$

The voltage at floating gate 2 during programming and/or verification can be expressed by the following equation (3):

$$\begin{aligned} V_F(t) &= \alpha_C V_C + \alpha_D V_D(t) + \alpha_S V_S + Q_F(t)/C_T \\ &= \alpha_C [V_C - V^C_{TH}(t)] + \alpha_D V_D(t) + \alpha_S V_S \end{aligned} \quad (3)$$

where $Q_F(t)$ represents amount of charge at time t at the floating gate 2.

In programming and/or verification, the threshold voltage $V^C_{TH}(t)$ at the control gate 1, induced by the amount of charge carriers at the floating gate 2, is defined by the following equation (4):

$$V^C_{TH}(t) = -\frac{Q_F(t)}{C_C} \quad (4)$$

As shown in equation (4), the threshold voltage $V^C_{TH}(t)$ indicates a threshold voltage shift by induced charge amount $Q_F(t)$ measured at the control gate 1 at time t. The threshold voltage shift by a charge $Q_F$ refers to a threshold voltage measured at the control gate 1, which is caused by the charges accumulated at the floating gate 2.

Figure 1A:
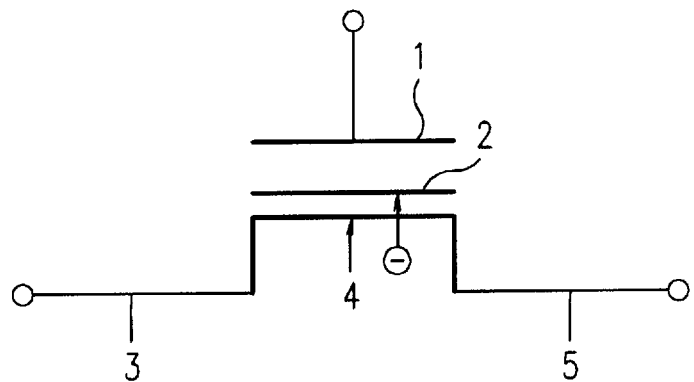
FIG. 1A is a circuit diagram of a conventional nonvolatile memory cell.
Figure 1B:
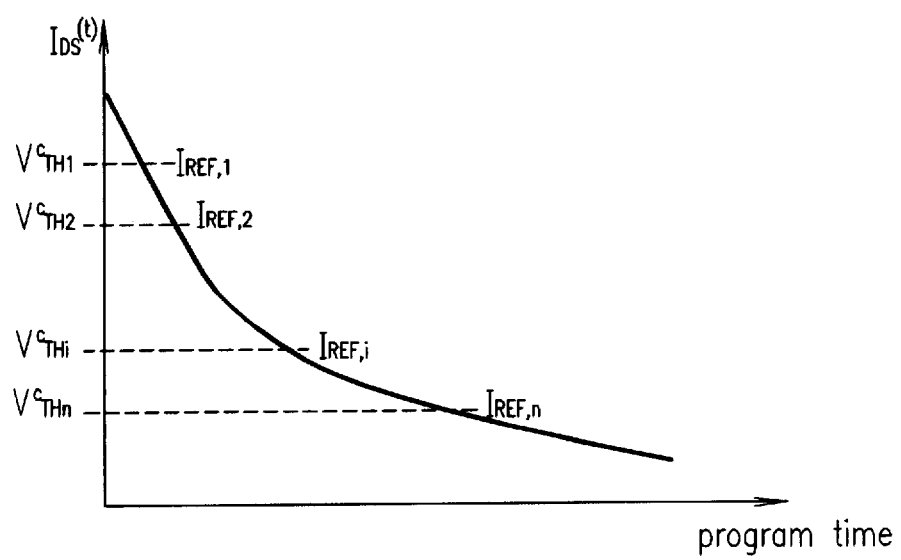
FIG. 1B is a graph for explaining the automatic verification/programming principle of the conventional nonvolatile memory of FIG. 1A.

The threshold voltage $V^F_{TH}$ at the floating gate 2 is an inherent threshold voltage of the field effect transistor consisting of the floating gate 2, source 3, and drain 5, which is dependent on manufacturing conditions, such as channel ion implantation and thickness of a gate insulator in fabricating the nonvolatile memory cell 10 of FIG. 1. Therefore, the threshold voltage $V^F_{TH}$ of the floating gate 2 is always constant. However, threshold voltage $V^C_{TH}$ at the control gate 1 is dependent on an amount of charge carriers $Q_F$ at the floating gate 2.

Each level programming and/or verification is forced to stop when the voltage $V_F(t)$ at the floating gate 2 reaches the reference voltage $V^F_{REF}$ at the floating gate 2. When the drain voltage $V_D$ is constant, the level of current flow $I_{D,i}(t)$ is dependent on the voltage at the floating gate 2, and the level of current flow has a relation of one to one with the voltage $V_{F,i}$ at the floating gate 2. Accordingly, the programming and/or verification stop time point for each level corresponds to the time point when the current $I_D(t)$ reaches the reference current $I_{REF}$. Therefore, in each threshold level programming, the voltage $V_F(t_P)$ of the floating gate 2 at the time of programming and/or verification completion for every level can be expressed by the following equation (5):

$$V_F(t_P) = V^F_{REF} = \alpha_C[V_C - V^C_{TH}(t_P)] + \alpha_D V_D + \alpha_S V_S \quad (5)$$

Rearranging the equation (5) with regard to the threshold voltage $V^C_{TH}(t_P)$ at the control gate 1 from the first voltage source 6, the following equation (6) is given:

$$V^C_{TH}(t_P) = V_C + \frac{\alpha_D V_D + \alpha_S V_S - V^F_{REF}}{\alpha_C} = V_C + V1 \quad (6)$$

where V1 is defined as:

$$V1 = \frac{\alpha_D V_D + \alpha_S V_S - V^F_{REF}}{\alpha_C} \quad (7)$$

If the three parameters of the drain voltage $V_D$, source voltage $V_S$ and reference voltage $V^F_{REF}$ are adjusted to make the V1 at the completion time of each level programming and/or verification a fixed constant, the relation of shifts of the control gate voltage $V_{C,i}$ and the threshold voltage $V^C_{TH,i}$ are linear to each other.

One of the ways to make the voltage V1 a fixed constant is to make each of the drain voltage $V_D$, source voltage $V_S$ and reference voltage $V^F_{REF}$ a fixed constant for each level of programming and/or verification. Making the reference voltage $V^F_{REF}$ constant is the same as making the reference current $I_{REF}$ constant. However, as can be noted in equation (5), each of the drain voltage $V_D$ and source voltage $V_S$ can be constant only if their values at the time of finishing each level programming are the same. In other words, although the drain voltage $V_D$ and the source voltage $V_S$ may be variables dependent on time, it will serve the purpose only if each of their values at the completion time of each level programming and/or verification are the same. As shown from equation (5), the control gate voltage $V_{C,i}$ at each i-th level also can be a variable dependent on time. In such a case, the first voltage $V_{C,i}$ in equation (5) is a value at the completion time of each level programming and/or verification.

By making V1 a constant for each level programming, the control gate voltage $V_{C,i}$ required for i-th threshold level programming can be expressed according to equation (6) as the following:

$$V^C_{TH,i} = V_{C,i} + V1 \ (\text{where } i=0, 1, 2, 3, \ldots, n-1) \quad (8)$$

Figure 5B:
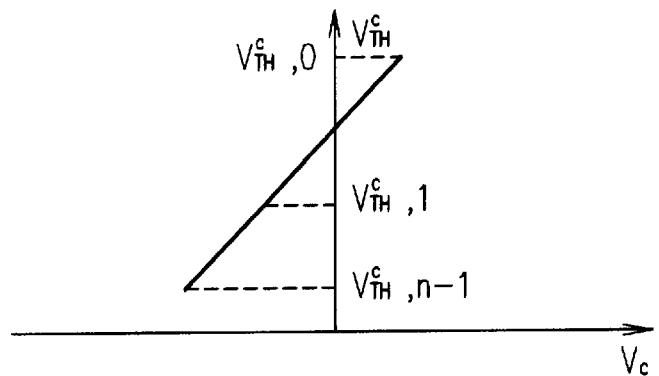
FIG. 5B is a graph showing a relation between a voltage at a floating gate and a current at a drain.

As shown in equation (8), the threshold levels to be programmed and the control gate voltages applied corresponding to the threshold levels are linear with a slope of, e.g., 1, as shown in FIG. 5B. According to equation (4), the charge amounts in the floating gate 2 are also linear with respect to the control gate voltages.

Since the $V_1$ is constant as mentioned above, the shift $\Delta V^C_{TH,i}$ of the threshold voltage applied to the control gate 1 during a multi-level programming can be expressed directly as the following equation (9):

$$\Delta V^C_{TH,i} = \Delta V_{C,i} \tag{9}$$

From equations (8) and (9), it can be shown that a shift of a threshold voltage $V^C_{th,i}$ can be accurately controlled by a shift of the control gate voltage $V_{C,i}$ in single or multi-level programming and/or verification. Such method may be applicable to any nonvolatile memory if the nonvolatile memory has a general system including a control gate, channel region, source and drain, even if the system is modified to some extent. It can be shown that the control gate voltage becomes the threshold voltage when the constant shown in the equation (7) is set to zero. Also, it can be shown that the above conclusion is directly applicable to any type of memories.

The following two methods for monitoring a programming operation in case the above conclusion may be applicable to programming of a nonvolatile memory.

The first method is a channel ON-TO-OFF method in which the channel 4 is turned on at an initial stage of the programming to cause the greatest amount of drain current to flow. The charge carriers, e.g., electrons, are injected into the floating gate 2 during programming to cause floating gate voltage to decrease with subsequent decrease of the drain current until the drain current reaches a predetermined reference current $I_{REF}$.

The second method is a channel OFF-TO-ON method which is opposite to the channel ON-TO-OFF method, in which voltages are applied to each electrode for not only turning off the channel 4 at an initial stage of a programming operation, i.e., for causing the floating gate voltage to be lower than the floating gate threshold voltage $V^F_{TH}$, but also for causing the charge carriers to be transferred from the drain 5 to the floating gate 2. As programming proceeds, the voltage in the floating gate 2 rises to reach higher than the floating gate threshold voltage $V^F_{TH}$ at the end when the channel is turned on. A stop point of the programming may be a moment when the channel is turned on or may be any arbitrary time after the turn on. In other words, the reference current $I_{REF}$ may be the threshold current $I_{TH}$, or may be any arbitrary value greater than the threshold current $I_{TH}$, as shown in FIG. 4E.

Figure 5C:
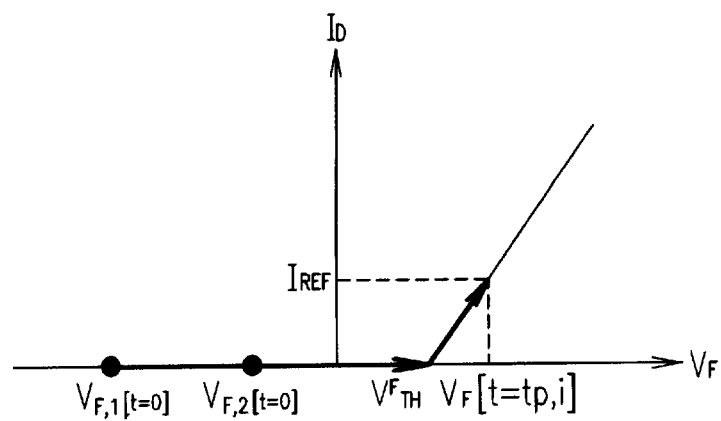
FIG. 5C is a graph showing variation of a current from start to finish of a programming and/or verification for each threshold level.

For multi-level programming and/or verification, as the control gate voltages $V_{C,i}$, which correspond to each level, are varied, the initial floating gate voltages $V_{F,i}(t=0)$ of each level programming are also varied, which is shown in FIG. 5C. For each level programming and/or verification, the voltage $V^F_{REF}$ (or $I_{REF}$) is a constant, and the voltage $V_{C,i}$ changes as the i-th level changes to program the i-th threshold voltage level $V^C_{TH,i}(t=t_p)$. The drain current $I_{D,i}(t<t_O)$ before the turn-on is zero, and the turn on point and the programming completion point are dependent on characteristics of a transistor.

The ON-TO-OFF method is disclosed in a U.S. patent application Ser. No. 08/542,652 invented by the same inventor and commonly assigned to the same assignee. The method of programming and/or verification of the present invention is related to the OFF-TO-ON method. In comparison to the ON-TO-OFF method, the OFF-TO-ON method has smaller power consumption. When an ON threshold is detected as the programming stop point, a sense amplifier may be implemented very simply.

From the above, e.g., in the OFF-TO-ON method programming, when a shift $\Delta V^C_{TH,i}$ from the erasure state, which is the highest level, to one of the corresponding threshold levels is determined, a programming for the level can be done by applying a value obtained by subtracting the shift $\Delta V^C_{TH,i}$ to a desired level from already known highest level $V_{C,0}$ value as a control gate voltage, and then waiting until the automatic completion of the programming and/or verification is done by the current detector 9 of FIG. 2. Meanwhile, the completion time point of each level programming is dependent on the electrical characteristics of a memory cell and the voltage applied to each node.

Methods for determining the control gate voltage $V_{C,0}$ and the reference current $I_{REF}$ for use in the highest level programming will be explained. Once the desired highest level $V^C_{TH,0}$, drain voltage $V_D$ and source voltage $V_S$ of a given memory cell are determined, the two parameters of the highest level value/voltage $V_{C,0}$ and the reference voltage $V^F_{REF}$ are left from equations (7) and (8). Since the drain voltage $V_D$ and source voltage $V_S$ are fixed, the reference voltage $V^F_{REF}$ has a one to one correspondence to the reference current $I_{REF}$. When the voltages $V^C_{TH,0}$, $V_D$ and $V_S$ are applied to the memory cell, an initial drain current $I_{G,0}$ is measured. The current $I_{G,0}$ at this time is the same as the $I_{REF}$. In this case, the voltage $V_{C,0}$ is determined by taking the programming time into consideration. Once the $V_{C,0}$ is determined, the reference current $I_{REF}$ can be determined by the aforementioned method. As can be appreciated by one of ordinary skill in the art, the reference current $I_{REF}$ may be measured by various methods other than the above.

In the above, the voltage V1, expressed in equation (7), is set as a fixed constant. As can be appreciated, the parameters in the equation (7) may be adjusted to vary the voltage V1 for every level programming. As can be seen from the equation (8), the control gate voltage $V_{C,i}$ and the corresponding threshold voltage $V^C_{TH,i}$ will have a nonlinear relationship. Accordingly, a shift of the control gate voltage and a shift of the corresponding threshold voltage $V^C_{TH,i}$ have values different from each other. In such a case, by adjusting the reference current $I_{REF}$ appropriately for every level, the threshold voltages for each level can be programmed to desired values after the nonlinear relation of the control gate voltage $V_{C,i}$ and the corresponding threshold voltage $V^C_{TH,i}$ is obtained.

In the above embodiment, the OFF-TO-ON programming method of the present invention is applied to a cell having a generally stacked-gate structure. However, as previously mentioned, this OFF-TO-ON method is also applicable to a programming of any memory cell having a plurality of threshold voltages. Further, the transfer of charge carriers may be done by a tunneling caused through a gate dielectric layer disposed between the substrate containing the source and drain, and the floating gate, or an insulating film between the floating gate and control gate. In any of the cases, the programming can be done if appropriate voltages are applied to each gate and electrodes, e.g., drain, source, and substrate so that while the cell is turned off, charge carriers, such as electrons and holes, are transferred from the floating gate. The programming and/or verification is stopped when the drain current reaches a predetermined reference current.

For example, in case the electrons are transferred from the floating gate to the drain, an electric field large enough to cause tunneling between the floating gate 2 and the drain 5 can be established if a negative voltage is applied to the control gate 1, a positive voltage to the drain 5, and a ground or a positive voltage lower than the drain voltage to the source and substrate. In this case, a drain voltage higher than the source voltage is applied such that a current eventually flows between the drain 5 and the source 3. The current flow is monitored to stop the programming when the level of current flow reaches the reference current value $I_{REF}$. As can be found from equations (7), (8) and (9), a programmed threshold voltage may or may not be greater than zero, depending on applied voltages. In case it is greater than zero, the memory cell acts as a depletion mode transistor.

The programming method of the present invention is also applied to a P-type transistor, and similar results can be obtained if polarities of applied voltages are altered. The programming method according to the present invention explained up to now is explained regardless of the programming mechanism, such as injection of hot carrier or tunneling. Therefore, it can be shown that the programming method of the present invention is applicable to any type of programming mechanism associated with the equation (3) of the present invention.

As previously discussed, an erasure, in the preferred embodiment, is an injection of charge carriers(or electrons) into the floating gate. Therefore, the erasure can be done either with hot carrier injection or with tunneling. In the present invention, the erased state results in a threshold level to be the highest, that is, $V^C_{TH,0}$ in volatile memory. In other words, all the nonvolatile memory cells within a given erasure block are programmed at the highest level. Accordingly, an erasure process can be done according to the following steps using, for example, an n-type transistor.

First, electrons are injected so that threshold levels of all the cells within a selected block become higher than the 0-th level, i.e., $V^C_{TH,0}$. With the 0-th level in which the voltage of control gate 1 is $V_{C,0}$, all the selected cells are programmed. Here, as has been explained, the value of the $V_{C0}$ may be arbitrarily chosen.

The present invention has various advantages over the prior art. Because only the control gate is varied for conducting every threshold voltage level programming, multi-level programming is easily implemented. Since the relationship between each of the threshold voltage levels and each of the corresponding control gate voltages is linear, and the shift of the threshold voltage is identical to the shift of the control gate voltage, an accurate adjustment of the shift of each level threshold voltage is available. Further, pre-programming prior to erasure is not required.

Programming and verifying can be simultaneously performed within the nonvolatile memory cell such that a separate circuit for verifying programming is eliminated, which decreases the time required for programming and verification. Power consumption is also very small since the programming stops when the cell goes from turn-off to turn-on.

Moreover, the accuracy of multi-level programming, i.e., the error distribution of programmed threshold voltages, can be precisely determined by parameters fixed at the time of fabrication of the nonvolatile memory and by applied bias voltages. Accordingly, the error distribution of the respective levels of the nonvolatile memory of the present invention is not dependent on numerous program/erase cycles. Even during programming, the memory is not dependent on traps of charges in an oxide layer, channel mobility, bit line resistance, and unstable or unpredictable electric parameters. The voltage-controlled type programming done by the control gate voltage of the method for programming a nonvolatile memory of the present invention also permits much easier and more accurate multi-level programming compared to the current-controlled type.

The foregoing description of preferred embodiment(s) of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of at least one of programming and verifying a threshold level for a nonvolatile memory cell having a control gate, a floating gate, a drain, a source, and a channel region between the drain and the source, the method comprising the steps of:

applying a first voltage, which varies in correspondence to each threshold level programming, to the control gate, applying a second voltage to the drain and applying a third voltage to the source, so that the channel region is turned off at an initial stage and charge carriers for the programming are transferred from the floating gate to at least one of the drain and source;

monitoring a conductivity of the channel region during each threshold level programming of the nonvolatile memory cell; and stopping application of at least one among the first voltage, second voltage and third voltage to stop the programming when the monitored conductivity reaches a reference value.

2. A method of claim 1, wherein the reference value is a fixed constant during each threshold level programming of a plurality of threshold levels.

3. A method of claim 1, wherein the step of monitoring a conductivity of the channel region includes a step of monitoring a voltage at the floating gate.

4. A method of claim 1, wherein the step of monitoring a conductivity of the channel region includes a step of monitoring a current flowing through the drain during each threshold level programming.

5. A method of claim 1, wherein the step of monitoring a conductivity of the channel region includes a step of monitoring a variation of a charge carrier amount in the floating gate.

6. A method of claim 1, wherein the first voltage varies linearly to threshold levels of the memory cell.

7. A method of claim 1, wherein the first voltage is a negative value which varies in correspondence to each level programming in multi-level programming, and each of the second and third voltages is a positive value.

8. A method of claim 7, wherein the third voltage is one of a ground and a positive voltage lower than the second voltage.

9. A method of claim 1, wherein the reference value is a threshold value of the nonvolatile memory cell.

10. A method of claim 1, wherein an erasure of the nonvolatile memory cell is done by injection of electrons into the floating gate in an arbitrary method so that the nonvolatile memory cell has the highest threshold voltage.

11. A method of claim 10, wherein the arbitrary method is at least one of hot carrier injection and tunneling.

12. A method of claim 1, wherein the floating gate, source, drain and channel region are included in one of an N-type transistor and a P-type transistor.

13. A method of at least one of programming and verifying a nonvolatile memory cell to one of a plurality of threshold levels, the nonvolatile memory cell having a control gate, a floating gate, a drain, a source, and a channel region between the drain and the source, the method comprising the steps of:

applying a first voltage to the control gate, applying a second voltage to the drain and applying a third voltage to the source, so that the channel region is turned off at an initial stage and charge carriers for the programming are transferred from the floating gate to at least one of the source and drain;

monitoring a conductivity of the channel region during programming of the nonvolatile memory dell; and cutting-off application of at least one voltage among the first voltage, second voltage and third voltage to stop the programming when the monitored conductivity reaches a reference value, wherein the reference value is a fixed constant for each threshold level of the plurality of threshold levels.

14. A method of at least one of setting and verifying a threshold voltage of a cell in a nonvolatile memory, the cell having a control gate, a floating gate, first and second electrode regions and a channel region between the first and second electrode regions, comprising the steps of:

accumulating an amount of negative charge carriers in the floating gate to a first level;

transferring the negative charge carriers from the floating gate to one of the first and second electrode regions to vary the amount of negative charge carriers in the floating gate;

monitoring a variation of the negative charge carriers in the floating gate; and discontinuing the transfer of negative charge carriers when the amount of negative charge carriers in the floating gate reaches a second level corresponding to the threshold voltage of the cell.

15. The method of claim 14, wherein the negative charge carriers are electrons.

16. The method of claim 15, wherein the negative charge carriers are accumulated to the first level such that the channel region is non-conductive.

17. The method of claim 16, wherein the negative first level of charge carriers in the floating gate induces a highest threshold voltage.

18. The method of claim 14, wherein the negative charge carriers are accumulated and transferred by at least one of hot carrier injection and tunneling.

19. The method of claim 14, wherein the negative step of transferring the charge carriers comprises:

applying at least one of a first voltage, a second voltage and a third voltage to at least one of the control gate, the second electrode region and the first electrode region, respectively.

20. The method of claim 19, wherein the threshold voltage and the first voltage have a constant relationship.

21. The method of claim 14, wherein the step of monitoring the variation of the charge carrier comprises the steps of:

comparing a current flow through one of the first and second electrode regions to a reference current value.

22. The method of claim 21, wherein the application of at least one of the first, second and third voltages is discontinued when the current flow equals the reference current value.

23. A method of at least one of programming and verifying a memory cell to one of a plurality of threshold levels, the memory cell having a control gate, a floating gate, first and second electrode regions and a channel region between the first and second electrode regions, comprising the steps of:

accumulating negative charge carriers in the floating gate to a first charge amount level; and transferring the negative charge carriers in the floating gate to one of the first and second electrode regions to a second charge amount level inducing one of the plurality of threshold levels on the control gate.

24. The method of claim 23, wherein the charge carriers are electrons.

25. The method of claim 23, wherein the negative charge carriers accumulated in the floating gate induce a highest threshold voltage on the control gate.

26. The method of claim 23, wherein the first charge amount level corresponds to a voltage level below a threshold voltage of the floating gate when the negative charge carriers are electrons.

27. The method of claim 23, wherein the negative charge carriers are accumulated and transferred by at least one of hot carrier injection and tunneling.

28. The method of claim 23, wherein the step of transferring the negative charge carriers comprises the steps of:

applying a control gate voltage and first and second voltage to the control gate and first and second electrodes regions, respectively;

monitoring a variation of the negative charge carriers in the floating gate; and discontinuing the application of at least one of the control gate voltage, first voltage and second voltages when the amount of negative charges carriers in the floating gate reaches the second charge amount level.

29. The method of claim 28, wherein the control gate voltage varies in accordance with a threshold voltage to be programmed in the nonvolatile memory cell.

30. The method of claim 29, wherein the control gate voltage applied and the threshold voltage to be programmed vary linearly.

31. The method of claim 28, wherein the step of monitoring the variation of the negative charge carrier comprises the step of comparing a level of current flowing through one of the first and second electrode regions to a reference value.

32. The method of claim 31, wherein the application of at least one of the control gate voltage, first voltage and second voltage is discontinued when the level of current flow is equal to the reference value.

33. The method of claim 31, wherein the control gate voltage varies in accordance with a threshold voltage to be programmed in the nonvolatile memory cell.

34. The method of claim 23, wherein the reference value is constant for every threshold voltage to be programmed in the nonvolatile memory cell.

35. The method of claim 28, wherein the control gate voltage is a constant voltage.

36. The method of claim 19, wherein the first voltage varies in accordance with the threshold voltage to be set in the nonvolatile memory cell.

37. The method of claim 35, wherein the control gate voltage and the threshold voltage vary linearly.

38. The method of claim 14, wherein the charge carriers are negative charge carriers.

* * * * *